United States Patent [19]

Nakayama

[11] 4,439,745
[45] Mar. 27, 1984

[54] AMPLIFIER CIRCUIT

[75] Inventor: Kazuaki Nakayama, Tokyo, Japan

[73] Assignee: Pioneer Electronic Corporation, Tokyo, Japan

[21] Appl. No.: 301,867

[22] Filed: Sep. 14, 1981

[30] Foreign Application Priority Data

Sep. 16, 1980 [JP] Japan .................................. 55-128188

[51] Int. Cl.$^3$ .............................................. H03F 3/04
[52] U.S. Cl. .................................... 330/296; 330/288; 330/290
[58] Field of Search ................ 330/288, 290, 296, 311

[56] References Cited

U.S. PATENT DOCUMENTS 4,103,248  7/1978  Idei .................................... 330/288

Primary Examiner—James B. Mullins
Assistant Examiner—Gene Wan
Attorney, Agent, or Firm—Sughrue, Mion, Zinn, Macpeak, and Seas

[57] ABSTRACT

In an amplifier circuit having a first bipolar transistor receiving an input signal and coupled to the base of a second bipolar transistor of opposite conductivity, DC offset at the amplifier output is prevented by connecting a constant current source in parallel with the emitter resistor of the second transistor. DC feedback can be coupled from the amplifier output to the emitter of the second transistor and/or to a circuit component affecting the value of the input voltage at the base of the first transistor.

6 Claims, 2 Drawing Figures

AMPLIFIER CIRCUIT

BACKGROUND OF THE INVENTION

This invention relates to amplifier circuits, and more particularly to a distortionless amplifier circuit having bipolar transistors.

In an amplifier circuit using bipolar transistors, the output signal is unavoidably distorted due to the nonlinearities of the transistors. The degree of distortion is usually reduced by negative feedback, but this is disadvantageous in that oscillation may be caused in the amplifier or the gain of the amplifier decreased. In order to overcome these drawbacks, an amplifier circuit has been proposed, which decreases the degree of signal distortion while operating stably, without using a negative feedback technique. In this known distortionless amplifier circuit, currents are supplied, in a predetermined ratio, to a pair of bipolar transistors which are of opposite electrical conductivity, so that the difference between the base-emitter voltages $V_{BE}$ of the transistors is maintained constant or zero and the nonlinearities of each transistor cancel one another.

FIG. 1 shows one example of such an amplifier circuit. A PNP transistor $Q_2$ and an NPN transistor $Q_3$ are amplifying transistors whose nonlinearities should be cancelled out. An input $v_i$ is applied to the base of the transistor $Q_2$, the emitter output of which is applied to the base of the transistor $Q_3$. In order to supply currents $I_2$ and $I_3$ with a predetermined ratio to the transistors $Q_2$ and $Q_3$, a current mirror circuit consisting of transistors $Q_5$ and $Q_6$ and emitter resistors $R_1$ and $R_2$ is provided. The transistor $Q_5$ is diode-connected, so that a current defined by a current mirror ratio with respect to a current flowing in the transistor $Q_5$ is also provided by the transistor $Q_6$. The current mirror ratio is set by the resistors $R_1$ and $R_2$.

The circuit output is provided through an output load resistor $R_L$. The transistor $Q_5$ and an output current supplying transistor $Q_4$ also form a current mirror circuit, so that a current $I_4$ in a predetermined ratio with the current flowing in the transistor $Q_5$ is supplied by the transistor $Q_4$. This current ratio is defined by the ratio of the resistance values of resistors $R_1$ and $R_3$. In the circuit shown in FIG. 1, in order to make an output ($V_O$) DC voltage zero, a constant current source ($I_4$) is included for providing current which is substantially equal to the DC current $I_4$ from the transistor $Q_4$. Therefore, substantially no DC current is fed to the resistor $R_L$. However, in practice, the output $v_O$ unavoidably involves a DC off-set voltage, and accordingly some DC negative feedback is required. For this purpose, an emitter current controlling transistor $Q_7$ is connected between the emitter resistor $R_E$ of the transistor $Q_3$ and a negative power source ($-Vcc$), and the transistor $Q_7$ is controlled by a DC feedback system circuit 1, so that the output off-set voltage is zeroed.

A field-effect transistor $Q_1$, resistors $R_g$ and $R_S$ and a constant current source ($I_D$) form an input stage amplifier for providing a base input $v_i$ for the PNP transistor $Q_2$.

With the circuitry arranged as shown in FIG. 1, the output $v_O$ can be represented by the following expression (1):

$$v_O = (v_i + V_{BE2} - V_{BE3}) \cdot R_L / R_E \qquad (1)$$

where $V_{BE2}$ and $V_{BE3}$ are the base-emitter voltages of the transistors $Q_2$ and $Q_3$, and $I_3 = I_4$. In general, the relationship between the current I of a transistor and its base-emitter voltage $V_{BE}$ is represented by the following expression (2):

$$V_{BE} = \frac{kT}{q} \ln \frac{I}{I_S} \qquad (2)$$

where k is Boltzman's constant, T is the junction absolute temperature, $I_S$ is the reverse saturation current, and q is the electron charge. Therefore, if the transistors $Q_2$ and $Q_3$ have equal electrical characteristics and are both satisfactory in thermal coupling, then $$V_{BE2} - V_{BE3} = \frac{kT}{q} \ln \frac{I_2}{I_3} \qquad (3)$$

If $I_2/I_3 = \alpha$ (constant) is obtained by the current mirror circuit, then the expression (3) can be rewritten into the following expression (4):

$$V_{BE2} - V_{BE3} = \frac{kT}{q} \ln \alpha \qquad (4)$$

That is, the expression (4) has a constant value $\gamma$. Therefore, the following expression (5) can be obtained from the expression (1):

$$v_O = (v_i + \gamma) R_L / R_E \qquad (5)$$

Thus, the output $v_O$ is a distortionless signal which is independent of the transistor base-emitter voltages $V_{BE}$. If, in the expression (5), the current mirror ratio $\alpha$ is set to one (1), then $\gamma = 0$. Therefore, only a distortionless AC component is generated at the output $V_O$.

However, since some DC off-set voltage is invariably developed in the output $V_O$ as was described before, it is necessary to employ some DC feedback to control the current through the transistor $Q_7$, to thereby eliminate the DC off-set voltage. Thus, the equivalent emitter resistance $r_e$ of the transistor $Q_7$ is connected in series with the emitter resistor $R_E$ which is a circuit gain determining resistor, and the value $R_E$ in the expression (5) can then be equivalently represented by ($R_E + r_e$). The resistance $r_e$ is non-linear, and therefore it is necessary to bypass it with a capacitor $C_E$ having a large capacitance, so that the emitter resistor is grounded out in an AC sense. Due to this capacitor, however, the frequency response is such that the gain in the low frequency range is different from the gain in the middle and high frequency ranges, and the phase is variable. Furthermore, depending on the materials of the capacitor $C_E$, the tone quality is adversely affected. Since the capacitance is considerably large, it is impossible to provide the amplifier circuit in the form of an integrated circuit. In addition, since the emitter current of the transistor $Q_3$ flows in the gain determining resistor $R_E$, noise due to current is disadvantageously increased.

SUMMARY OF THE INVENTION

Accordingly, an object of this invention is to provide an amplifier circuit in which the above-described difficulties have been eliminated without using the bypass capacitor.

The foregoing object of the invention is achieved by the provision of an amplifier circuit comprising: a first transistor to the base of which an input signal is applied; a second transistor opposite in electrical conductivity to the first transistor, the output of the first transistor being applied to the base of the second transistor; and a current mirror circuit for supplying currents, in a predetermined ratio, to the first and second transistors. The amplifier circuit further comprises a constant current for producing a current substantially equal to a DC current flowing in the second transistor, the constant current source having a current output terminal connected directly to the emitter of the second transistor so that the emitter resistor of the second transistor for determining circuit gain can be connected directly to a reference potential point, e.g., ground.

BRIEF DESCRIPTION OF THE DRAWINGS

This invention will be described with reference to the accompanying drawings, in which.

DESCRIPTION OF THE PREFERRED EMBODIMENTS

Figure 1:
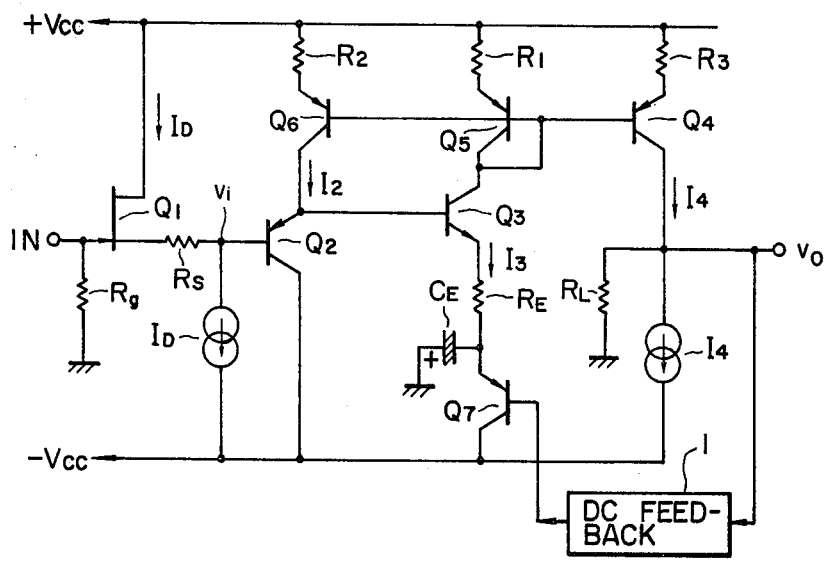
FIG. 1 is a circuit diagram showing one example of a conventional distortionless amplifier circuit.
Figure 2:
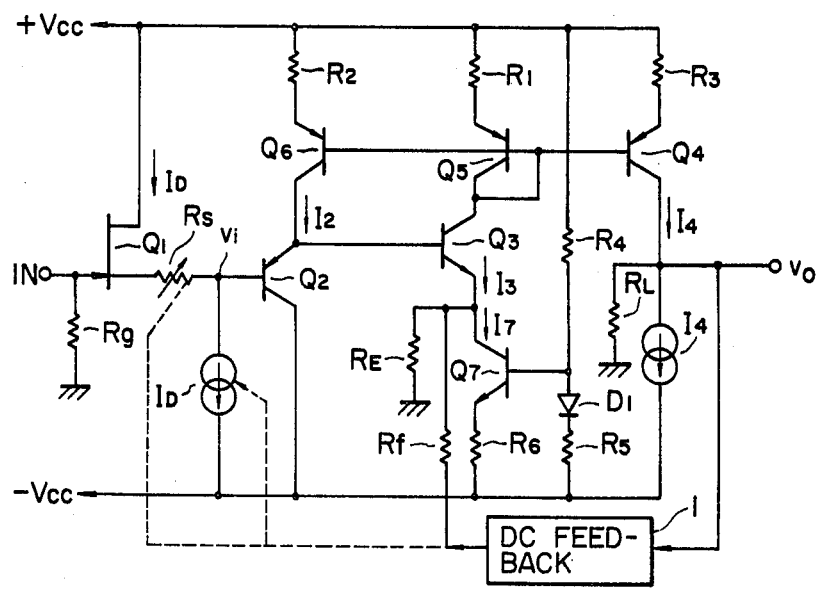
FIG. 2 is a circuit diagram showing one example of a distortionless amplifier circuit according to this invention.

FIG. 2 is a circuit diagram showing one example of an amplifier circuit according to the invention. In FIGS. 2 and 1, like parts are designated by like reference characters. In the example of FIG. 2, a constant current source consisting of a transistor $Q_7$, a diode $D_1$ and resistors $R_4$, $R_5$ and $R_6$ is provided, and the constant current $I_7$ is selected to be substantially equal to the DC current $I_3$ flowing in the transistor $Q_3$. The current output terminal of the constant current source is connected to the emitter terminal of the transistor $Q_3$, so that the DC current $I_3$ flowing in the transistor $Q_3$ is absorbed by the constant current source in the absence of an AC signal. Therefore, no DC current flows in the gain determining resistor $R_E$ which is connected to the emitter of the transistor $Q_3$, and accordingly no voltage is developed across the resistor $R_E$. Thus, the other terminal of the resistor $R_E$ can be directly grounded. That is, it is completely unnecessary to provide a bypass capacitor. Furthermore, since the impedance which is obtained when the collector of the transistor $Q_7$ is taken into account is extremely high, the gain and distortion of the entire circuit will not be adversely affected.

DC feedback for eliminating the output off-set voltage is applied to the connecting point between the transistor $Q_7$ and the emitter of the transistor $Q_3$. The resistance of a resistor $R_f$ is so selected that it is much higher than that of the resistor $R_E$ ($R_f \gg R_E$). Thus, for instance, if a positive voltage is developed at the output terminal, the positive voltage is transferred by means of the feedback system circuit 1 and the resistor $R_f$ to increase the emitter potential of the transistor $Q_3$. As a result, the current $I_3$ of the transistor $Q_3$ is decreased, and the output current $I_4$ is also decreased, thereby eliminating the output off-set voltage.

A voltage $V_E$ across the emitter resistor $R_E$ can be represented by the following expression (6).

$$V_E = (V_{GS} - V_S) + (V_{BE2} - V_{BE3}) \quad (6)$$

where $V_{GS}$ is the gate source voltage of the transistor $Q_1$, and $V_S$ is the voltage across a resistor $R_S$. Therefore, the DC feedback may be carried out so as to control $V_S$, i.e. ($I_D \cdot R_S$), so that the value of expression (6) is zero. Two examples of the DC feedback are as indicated by the dotted lines in FIG. 2. In one of the examples, the value of the constant current source ($I_D$) is controlled, and in the other example the resistance of the resistor $R_S$ is controlled.

As is apparent from the above description, according to this invention, the bypass capacitor is dispensed with, and accordingly the frequency response of the amplifier circuit is uniform through out the DC range, and the amplifier circuit can provide a distortionless output. Furthermore, the amplifier circuit is stable, being free from phase shift. Still further, since no DC current flows in the resistor $R_E$, the amplifier circuit is substantially free from noise due to current, and it can be easily provided in the form of an integrated circuit.

What is claimed is:

1. In amplifier circuit of the type including an input terminal for receiving an input signal, a first transistor having a base and providing an output, coupling means for coupling said input signal to the base of said first transistor, a second transistor of opposite conductivity type from said first transistor and having a base terminal receiving said output from said first transistor, an impedance element having one terminal coupled to a second terminal of said second transistor for determining circuit gain, and current supply means for supplying currents having a predetermined ratio to said first and second transistors, the improvement comprising:
   a constant current source for producing at an output terminal a current substantially equal to a DC current flowing through said second transistor, said constant current source being connected in series with said second transistor with said current source output terminal being coupled to the connection point between said impedance element and second terminal.

2. An amplifier circuit as defined in claim 1, wherein said second terminal is an emitter.

3. An amplifier circuit as defined in claim 1, further comprising:
   an amplifier output; and
   DC feedback means providing a DC feedback signal from said amplifier output to said one terminal of said impedance element.

4. An amplifier circuit as defined in claim 1, further comprising:
   an amplifier output;
   feedback means for providing a DC feedback signal from said amplifier output; and
   said coupling means including means controlled by said DC feedback signal for varying the voltage supplied to said base of said first transistor.

5. An amplifier circuit as defined in claim 4, wherein said coupling means comprises:
   an input transistor having an input terminal for receiving said input signal and an output terminal;
   a coupling resistor coupling said input transistor output to said first transistor base; and
   a current source coupled to said first transistor base, said current source being controlled by said DC feedback signal.

6. An amplifier circuit as defined in claim 4, wherein said coupling means comprises:
   an input transistor having an input terminal for receiving said input signal and an output terminal; and
   a coupling resistor coupling said input transistor output terminal to said first transistor base, said coupling resistor being a variable resistor controlled by said DC feedback signal.

* * * * *